US009553502B2

(12) United States Patent
Pasqualetto (10) Patent No.: US 9,553,502 B2
(45) Date of Patent: Jan. 24, 2017

(54) CONTROL OF AN INDUCTIVE LOAD WITH TEMPERATURE-SENSITIVE CURRENT REDUCTION MECHANISM (71) Applicant: Angelo Pasqualetto, Toulouse (FR)

(72) Inventor: Angelo Pasqualetto, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 129 days.

(21) Appl. No.: 14/368,032

(22) PCT Filed: Dec. 17, 2012

(86) PCT No.: PCT/EP2012/005216
§ 371 (c)(1),
(2) Date: Jun. 23, 2014

(87) PCT Pub. No.: WO2013/091826
PCT Pub. Date: Jun. 27, 2013

(65) Prior Publication Data
US 2015/0009730 A1    Jan. 8, 2015

(30) Foreign Application Priority Data
Dec. 21, 2011  (FR) ...................................... 11 03967

(51) Int. Cl.
*H02M 7/538* (2007.01)
*H02M 3/155* (2006.01)
(Continued)

(52) U.S. Cl.
CPC ........... *H02M 1/32* (2013.01); *H02M 7/53871* (2013.01); *H03K 17/0822* (2013.01);
(Continued)

(58) Field of Classification Search
CPC ............ H02M 1/32; H02M 2003/1555; H02M 7/53871; H03K 17/0822; H03K 2017/0806
See application file for complete search history.

(56) References Cited

U.S. PATENT DOCUMENTS 5,008,771 A * 4/1991 Palara .................... F02P 3/0552
327/512
5,945,857 A   8/1999 Havens
(Continued)

FOREIGN PATENT DOCUMENTS

EP    1035001 A2 *  9/2000  ........... B62D 5/0469
EP    2 031 758 A1   3/2009
(Continued)

OTHER PUBLICATIONS

International Search Report, dated Apr. 2, 2013, from corresponding PCT application.

*Primary Examiner* — Jessica Han
*Assistant Examiner* — Bart Iliya
(74) *Attorney, Agent, or Firm* — Young & Thompson (57) ABSTRACT The control of an inductive load is implemented by a control strategy to generate a control signal for a switching element on the basis of a setpoint datum, with a mechanism defining a maximum permitted value (Imax) of the current in the load as a function of the temperature at the level of the switching element. The mechanism exhibits a temperature threshold (Tshd). The maximum permitted value (Imax) of the current is held constant, equal to an upper limit value (Isup), during a temperature climb phase for all the temperatures which are lower than the threshold. The maximum permitted value of the current is abruptly rendered equal to a lower limit value (Iinf) as soon as the temperature reaches the threshold. Finally, during a temperature descent phase, the maximum permitted value of the current gradually climbs back to the upper limit value as the temperature decreases.

20 Claims, 3 Drawing Sheets (51) Int. Cl.
*H03K 17/08* (2006.01)
*H02M 1/32* (2007.01)
*H03K 17/082* (2006.01)
*H02M 7/5387* (2007.01)

(52) U.S. Cl.
CPC ............... *H02M 2003/1555* (2013.01); *H03K 2017/0806* (2013.01)

(56) References Cited

U.S. PATENT DOCUMENTS

| | | |
|---|---|---|
| 6,078,511 A | 6/2000 | Fasullo et al. |
| 6,320,438 B1 | 11/2001 | Arcus |
| 6,657,468 B1 | 12/2003 | Best et al. |
| 7,570,118 B1 * | 8/2009 | Gaboriau ................ H03F 1/523 330/10 |
| 2004/0047098 A1 | 3/2004 | Friedrichs et al. |
| 2004/0070910 A1 * | 4/2004 | Gergintschew .... H03K 17/0822 361/103 |
| 2004/0145963 A1 | 7/2004 | Byon |
| 2006/0244479 A1 | 11/2006 | Major |

FOREIGN PATENT DOCUMENTS

| | | |
|---|---|---|
| JP | 2006081350 A * | 3/2006 |
| KR | 20040066281 A | 7/2004 |
| WO | 9728601 A1 | 8/1997 |
| WO | 98/36361 A1 | 8/1998 |
| WO | 98/36496 A1 | 8/1998 |
| WO | 2006101188 A1 | 9/2006 |

* cited by examiner

PRIOR ART

CONTROL OF AN INDUCTIVE LOAD WITH TEMPERATURE-SENSITIVE CURRENT REDUCTION MECHANISM

The present invention pertains generally to the control of inductive loads, for example by pulse width modulation, and more specially to such control with temperature-sensitive current reduction mechanism (or TDCR function, the abbreviation standing for "Temperature Dependent Current Reduction").

BACKGROUND OF THE INVENTION

The invention finds applications, in particular, in the automotive sector, for example in systems for electronic control of an actuator, such as a device for electronic control of the throttle (or ETC device, the abbreviation standing for "Electronic Throttle Control") or of the burnt gases recirculation valve (or EGR device, the abbreviation standing for "Exhaust Gas Recirculation"), or of any other valve used in engine monitoring or the like, or more generally of any other item of equipment actuated by electric motor, such as a window winder, for example.

The control of inductive loads by pulse width modulation may in general be performed by a switching structure such as an H-bridge. This structure comprises four power switches, namely two "high" switches on the side of a positive power supply and two "low" switches on the side of a negative power supply or the ground.

A first pair formed of a first high switch and of a first low switch enables, when they are both closed, current to flow in the load in a certain direction. A second pair formed of the other high switch and of the other low switch enables conversely, when they are both closed, current to flow in the load in the opposite direction. The two low switches, or the two high switches, when they are both closed, allow the flow of a freewheeling current.

Each switch generally comprises a power MOS transistor (the acronym standing for "Metal Oxide Semiconductor". A sequence of analog control signals for the four MOS transistors is produced, according to a determined strategy, on the basis of a setpoint control signal. This setpoint control signal can be pulse width modulated, with a duty ratio making it possible to control the quantity of current injected into the load and therefore, on average, the intensity of the current in the inductive load.

For this purpose, the switching structure is alternately positioned in a certain state in which the flow in the load of a current of determined value is controlled in one or the other direction, and in another state in which a freewheeling current is permitted to flow in the load, through two transistors which are closed.

Gentle variations in voltage and current (called "Slew-Rate") are effected at the level of the control gates of the MOS transistors, so as to avoid sudden switchings that generate electromagnetic disturbances.

Energy losses at the level of the switches are of two different kinds: static losses, produced through the Joule effect when the switches are closed, and dynamic losses related to the switching of the switches. The former losses are related to the internal resistance $Rds_{ON}$ of the MOS transistors. The latter losses are related to the switching speed of the MOS transistors. The slower the variations in current and voltage, the more significant the dynamic losses.

The dynamic losses are essentially localized at the level of the transistors which do not participate in the freewheeling. They depend on the sweep rate (Slew-Rate) in voltage and in current.

In case of a spike in the current absorbed in the load, of insufficient cooling, and/or of too high an ambient temperature, the temperature at the level of the junctions of the MOS transistors, termed the "junction temperature", may rise beyond acceptable limits, which depend on the technology used.

This is why, in order to limit the rise in the junction temperature of the transistors and to thus avoid their destruction, it is possible to implement a temperature-sensitive current reduction mechanism or TDCR mechanism.

The effect of such a mechanism is to automatically reduce the current in the load when the junction temperature of the "low" transistors exceeds a first threshold (called the warning or "alert" threshold), lower than a second threshold (called the cutout or "Shutdown" threshold) beyond which the flow of current in the MOS transistors is interrupted so as to avoid their destruction. Such a TDCR mechanism intervenes on a maximum permitted value for the current in the load, which is used as high stop in the strategy for controlling the current in the transistors. The permitted maximum current is reduced, and then optionally increased again, in both cases in a linear manner, until a temperature-current equilibrium is reached. At this equilibrium point, the junction temperature and the maximum current permitted in the load are stabilized.

DESCRIPTION OF THE RELATED ART

Such a TDCR mechanism is implemented, for example, in the circuits TLE7209 from the company Infineon and L9958 from the company STMicroelectronics, and gives satisfactory results.

However, the pressure on fabrication costs in the automotive sector is leading to the use of ever smaller packages for the integrated circuits carrying out this type of control. Regulations are also prompting the elimination of soldered bonds for the link with the semi-conductor chips in which the MOS transistors are integrated, and their replacement by glue which is a less good thermal conductor. Therefore, the internal thermal resistance tends to increase.

Now, the result of the implementation of TDCR mechanisms of known type, as described hereinabove, is to prevent the current in the controlled loads from being able to reach the values that it may be necessary to reach, in a solely transient manner. Regular transient currents are what condition the dimensioning of an H-bridge.

SUMMARY OF THE INVENTION

The invention is aimed at eliminating, or at least lessening, all or some of the aforementioned drawbacks of the mentioned prior art.

For this purpose, a first aspect of the invention proposes a control device for an inductive load comprising:
- a switching structure with at least one switching element, adapted for driving a current of determined value in the load as a function of a setpoint datum,
- a control unit designed to implement a control strategy to generate at least one control signal for the switching element on the basis of the setpoint datum, with a mechanism consisting in defining a maximum permitted value of the current in the load between an upper limit value and a lower limit value, as a function of a value representative of the temperature at the level of the switching element.

According to embodiments of the device, the control unit is devised in such a way that:

during a temperature climb phase, the maximum permitted value of the current is held constant, equal to the upper limit value, as long as the temperature at the level of the switching element is lower than a first temperature threshold or high temperature threshold, the maximum permitted value of the current is abruptly rendered equal to the lower limit value as soon as the value of the temperature at the level of the switching element reaches the first temperature threshold, and during a temperature descent phase, the maximum permitted value of the current is increased gradually to the upper limit value as the temperature at the level of the switching element decreases.

Thus, an equilibrium point can be found through higher values of the temperature at the level of the switching element and through lower values of the maximum permitted value of the current in the load, having allowed the highest temperature to be reached in a transient manner only, therefore under conditions which do not imperil the integrity of the switching element.

If the transient thermal phenomenon is such that the high temperature threshold is not reached, then there is no reduction in current. In the prior art, the reduction in current begins as soon as the temperature warning threshold is exceeded.

A second aspect of the invention pertains to an integrated circuit comprising a device according to the first aspect hereinabove. It may be, for example, a microcontroller, an ASIC (the acronym standing for "Application Specific Integrated Circuit"), an SoC (the abbreviation standing for "System-on-Chip"), or similar.

A third aspect of the invention pertains to a control method for an inductive load comprising the steps consisting in:

driving a current of determined value in the load as a function of a setpoint datum, with the aid of a switching structure having at least one switching element, implementing a control strategy to generate at least one control signal for the switching element on the basis of the setpoint datum, with a mechanism consisting in defining a maximum permitted value of the current in the load as a function of a value representative of the temperature at the level of the switching element, between an upper limit value and a lower limit value.

According to embodiments of the method, the mechanism is such that:

during a temperature climb phase, the maximum permitted value of the current is held constant, equal to the upper limit value, as long as the temperature at the level of the switching element is lower than a first temperature threshold or high temperature threshold, the maximum permitted value of the current is abruptly rendered equal to the lower limit value as soon as the value of the temperature at the level of the switching element reaches the first temperature threshold, and during a temperature descent phase, the maximum permitted value of the current is increased gradually to the upper limit value as the temperature at the level of the switching element decreases.

In embodiments of the device and of the method, the setpoint datum can be the duty ratio of a periodic setpoint control signal. These embodiments allow the control of the current in the inductive load by pulse width modulation.

For example, the lower limit value of the maximum permitted value of the current in the load may be about 2.5 A. Such a current allows a mechanism propelled by a small electric motor to carry out the function in degraded mode, without leading to cutout. This reduces the gravity of the operating defect.

For example also, the high temperature threshold may be substantially equal to 170° C., and thus correspond to the cutout temperature of the known TDCR mechanisms. Stated otherwise, the high temperature threshold may be a cutout threshold, whose value is substantially equal, for example, to 170° C.

In embodiments, furthermore, the mechanism and the method are such that, if during the temperature climb phase the temperature is greater than a determined second threshold or low temperature threshold, which is lower than the high temperature threshold, while being lower than said high threshold, for a duration greater than a determined time lag, then the maximum permitted value of the current is abruptly rendered equal to the lower limit value before being gradually increased to the upper limit value during the temperature descent phase. In this way, avoidance of damage to the switching element is ensured.

For example, the value of the low temperature threshold may be substantially equal to the value of the high threshold less 10% to 15%, namely for example 150° C. if the high threshold is equal to 170° C. The low temperature threshold corresponds to the start of the reduction in the limitation current in the conventional TDCR mechanisms.

BRIEF DESCRIPTION OF THE DRAWING FIGURES

Other characteristics and advantages of the invention will become further apparent on reading the description which follows. The latter is purely illustrative and must be read with regard to the appended drawings in which.

DETAILED DESCRIPTION OF THE INVENTION

Figure 1A:
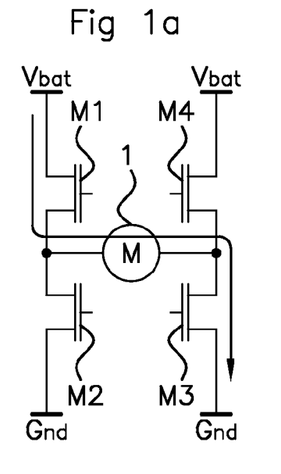
FIGS. 1a-1c are diagrams illustrating the control of an inductive load by pulse width modulation with the aid of an H-bridge.
Figure 1B:
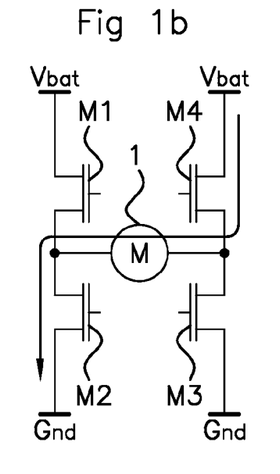
Figure 1C:
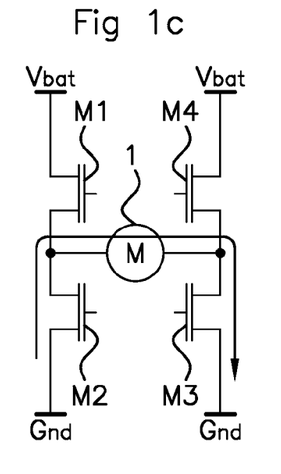

With reference to FIGS. 1a to 1c, a control device for an inductive load such as an electric motor 1 comprises, for example, a switching structure of "H-bridge" type.

Such a switching structure comprises four switches, each having, for example, a MOS power transistor. A first transistor M1 is connected between a positive power supply terminal brought for example to the voltage of the battery Vbat, and a first terminal of the motor. A second transistor M2 is connected between said first terminal of the motor and, for example, a ground terminal Gnd. A third transistor M3 is connected between a second terminal of the motor and the ground terminal Gnd. Finally, a fourth transistor M4 is connected between the positive power supply terminal Vbat and said second terminal of the motor. The transistors M1 and M4 are called high side transistors ("high side") and the transistors M2 and M3 are called low side transistors ("low side"). The bridge can be controlled according to three possible states.

In a first state, the pair formed of the high side transistor M1 and of the low side transistor M3 enables, when these transistors are on (switches closed), a current to flow through the motor 1 in a first direction, from Vbat to Gnd, as indicated by an arrow in FIG. 1a. Transistors M2 and M4 are then off (switches open).

Conversely, in a second state, the pair formed of the low side transistor M2 and of the high side transistor M4 enables, when these transistors are on (switches closed), a current to flow through the motor 1 in the opposite direction, still from Vbat to Gnd, as indicated by the arrow in FIG. 1b. The transistors M1 and M3 are then off (switches open).

Finally, in a third state illustrated by FIG. 1c, the high side transistors M1 and M4 are off (switches open) and the low side transistors M2 and M3 are on (switches closed). This makes it possible to evacuate the energy accumulated in the inductive load, in the form of a current flowing to ground Gnd through M2 and M3, after the opening of the transistor M1, as represented by the arrow in FIG. 1c. This state is referred to as the "freewheeling" state. It may be commanded subsequent to operation of the H-bridge in the aforementioned first state or second state. This freewheeling state can also be achieved through the on high side transistors (M1 and M4 closed) and the open low side transistors (M2 and M3 open).

It will be appreciated that the invention is not limited by the type of switching structure. In particular, it also applies to a half-bridge switching structure, or to a single power switch. Also, the embodiment of the power switch or switches shown in FIGS. 1a-1c is merely a nonlimiting example. These switches can each comprise another type of field-effect transistor (FET), a bipolar transistor (BJT, the abbreviation standing for "Bipolar Junction transistor"), an IGBT transistor (the abbreviation standing for "Insulated Gate Bipolar Transistor"), etc., instead of a MOS transistor. They can also comprise an assemblage of such transistors, optionally with other components such as resistors, capacitors, etc.

The control of the current in the load 1 can be performed by pulse width modulation (PWM) of a periodic setpoint control signal having a given setpoint duty ratio, which is used to generate switching signals for the transistor bridge.

Figure 2A:
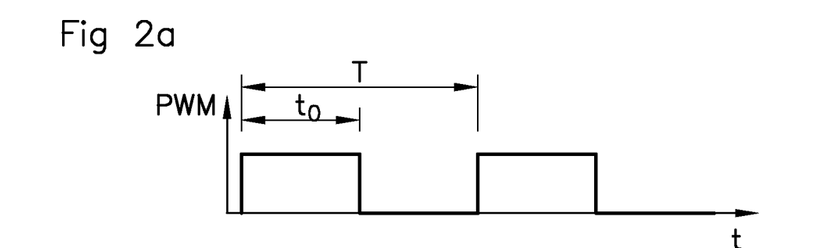
FIGS. 2a and 2b are graphs of a pulse width modulated periodic setpoint control signal, and of the evolution of the current in the controlled inductive load.

As represented in FIG. 2a, such a PWM setpoint control signal is, at each period, in a first determined logic state from among the high and low logic states for at least a first duration, and in the other logic state during the remainder of the period. In the example shown in the figure, the PWM signal is in the high logic state for a duration $t_0$ lower than the period T. The setpoint duty ratio $d_{com}$ is given by:

$$d_{com} = t_0/T \tag{1}$$

The setpoint duty ratio $d_{com}$ can vary, between 0% and 100%. It is most often used in the span 10% to 30%. The transient currents correspond to the span 80% to 100%.

Figure 2B:
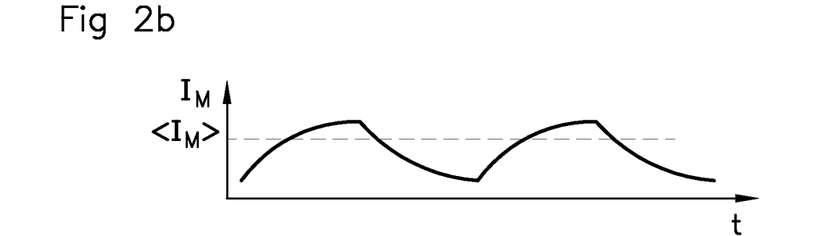

FIG. 2b shows the evolution of the instantaneous value of the current $I_M$ in the load (here a motor 1) obtained in response to the PWM setpoint control signal of FIG. 2a.

During the period of activation of the PWM signal, that is to say, for example, when this signal is in the high logic state, the current $I_M$ increases to a determined nominal value. The H-bridge is then controlled in the first or the second state, illustrated by FIGS. 1a and 1b, respectively, as a function of the direction of rotation of the motor which is desired.

During the period of deactivation of the PWM signal, that is to say in the example when this signal is in the low logic state, the current $I_M$ decreases to the zero value. The H-bridge is then controlled in the third state, illustrated by FIG. 1c, or freewheeling state.

On account of the inductive nature of the load constituted by the motor, the current $I_M$ climbs and descends with a gentle slope, unlike the square edges of the PWM signal.

The mean value $<I_M>$ of the current $I_M$ is given by:

$$<I_M> = d_{com} \times Vbat \times 1/R \tag{2}$$

where R is the total resistance of the circuit (principally that of the motor 1).

Figure 3A:
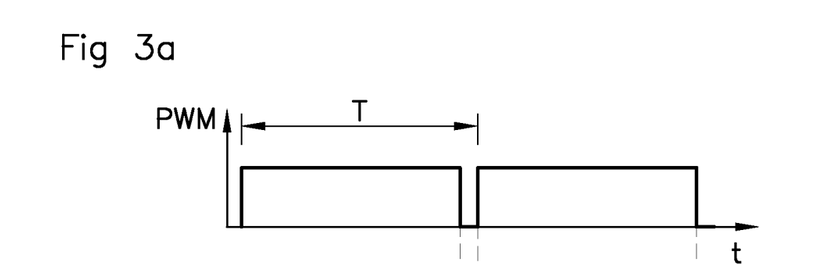
FIGS. 3a and 3b are graphs of a pulse width modulated periodic setpoint control signal, giving rise to a limitation of current in the controlled inductive load.
Figure 3B:
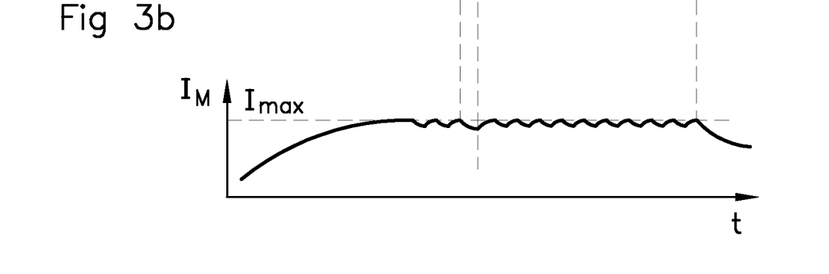

FIGS. 3a and 3b show that for the high values of duty ratio, the value $I_M$ may be limited to a value Imax. This is achieved by forcing the freewheeling state briefly each time that $I_M$ exceeds Imax.

Figure 4:
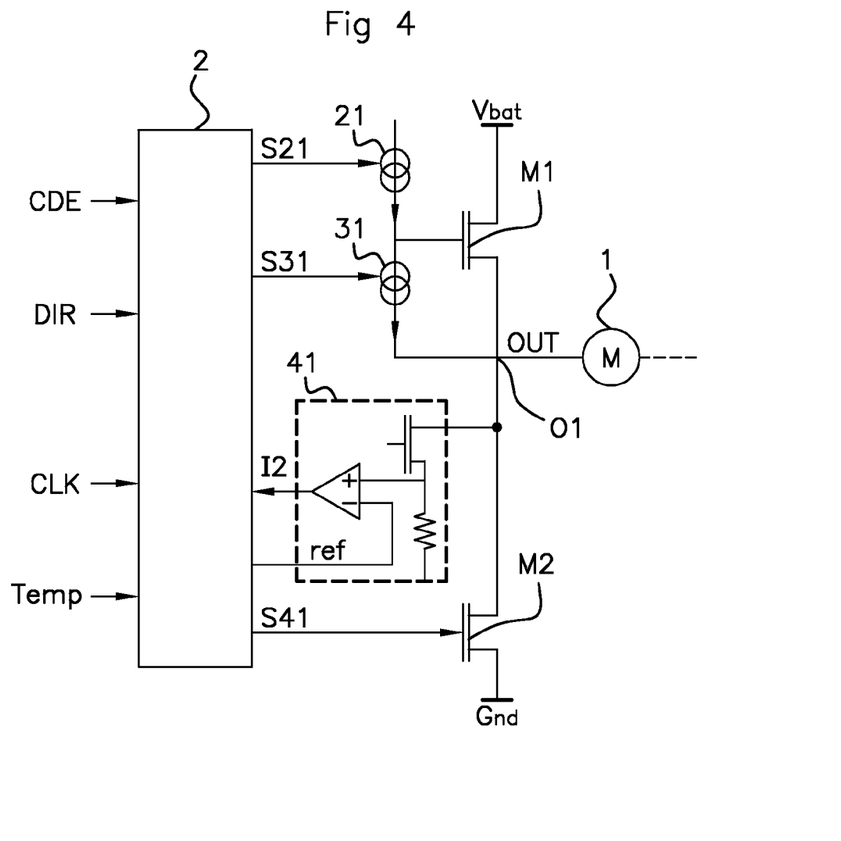
FIG. 4 is a functional diagram of an exemplary control device according to embodiments.

An embodiment of a control device is presented schematically in FIG. 4.

The device comprises a control unit 2, for example a microcontroller, an ASIC circuit, a microprocessor, an SoC or similar.

The unit 2 receives as input control signals CDE and DIR, as well as a clock signal CLK. It delivers as output control signals for the MOS transistors of the H-bridge supplying the motor 1, of which only the transistors M1 and M2 of FIGS. 1a-1c are represented here for the sake of clarity of the figure and of conciseness of the present disclosure. Likewise, the means for generating the sweep rate (Slew-Rate) will be detailed only for the transistor M1 alone. These means comprise a controlled current source 21 and a controlled current source 31, respectively designed to charge and discharge the control gate of the transistor M1. The current sources 21 and 31 are controlled, respectively, by a signal S21 and by a signal S31 generated by the control unit 2. For example, the slope (Slew-Rate) in current can be of the order of 3 A/µs and the slope in voltage 4 V/µs. The transistor M2 is directly controlled by a signal S41 generated by the control unit 2. A detector 41 delivers a logic signal 12 which signals to the unit 2 that the current passing through the transistor M2 exceeds Imax. The signal ref, which is linked to the "−" input of the comparator is proportional to Imax. This is also a signal which may be delivered by an output of the control unit 2.

On the input side of the control unit 2, the signal DIR is for example a binary logic signal which controls the direction of rotation of the motor, that is to say the direction of flow of the current through the H-bridge (see FIGS. 1a and 1b). The signal CDE is the setpoint control signal of PWM type, with the setpoint duty ratio $d_{com}$, which determines the quantity of current supplying the load, and therefore the speed and/or the torque of the motor 1.

The control unit 2 also receives a signal Temp, representative of the temperature Tj at the level of the junctions of the power transistors used as switches in the switching structure formed by the H-bridge. It may be an analog signal, in which case the unit 2 can comprise an analog-digital converter at the level of the input receiving it, or else be a digital signal whose simplest expression is on 2 bits (one for each of the temperature thresholds). It may be produced by any appropriate temperature sensor.

The control unit 2 is devised, for example through software and/or through hard-wired logic, to implement a control strategy for the switching structure. The control given by the implementation of this strategy is essentially dependent on the signals CDE and DIR, which determine a first-order setpoint for the current $I_M$ in the motor 1.

Furthermore, several mechanisms make it possible to refine the setpoint in terms of current, so as in particular to ensure a certain number of protections. In particular, the unit 2 implements a temperature-sensitive current reduction mechanism or TDCR mechanism. This mechanism consists in varying a value Imax, intervening in the control strategy, and which corresponds to the maximum permitted value for the current $I_M$ in the motor.

Figure 5:
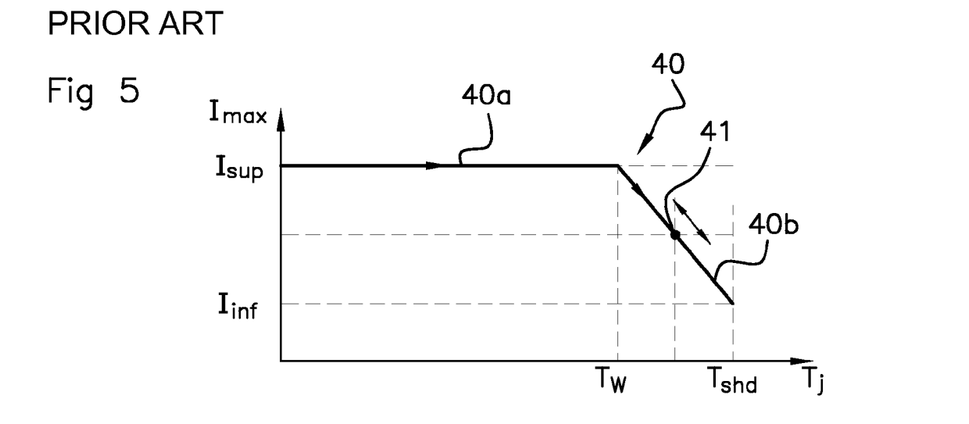
FIG. 5 is a graph illustrating the principle of a temperature-sensitive current reduction mechanism according to the prior art.

The graph of FIG. 5 illustrates the current limitation obtained with a TDCR function according to the prior art which was set forth in the introduction.

Such a mechanism acts on the value Imax intervening in the switching structure control strategy. More particularly, the mechanism reduces the value of Imax when the junction temperature Tj of the MOS transistors of this structure exceeds a first threshold Tw corresponding to a warning temperature. The temperature Tj may be the maximum of the temperatures of 4 sensors (one for each transistor) or else be measured by a single sensor placed at the center of the zone of installation of the 4 transistors.

Thus, as long as the temperature Tj is lower than Tw, the value of Imax is constant, equal to a determined value. The value of the current $I_M$ in the motor is determined as a function of the duty ratio $d_{com}$ of the setpoint control signal CDE. The corresponding portion 40a of the curve 40 giving Imax as a function of Tj, which is represented on the graph of FIG. 5, is a horizontal straight portion (or has a slightly negative slope).

However, for values of Tj beyond Tw, the value of Imax decreases linearly when Tj increases. The corresponding portion 40b of the curve giving Imax as a function of Tj is, as represented on the graph of FIG. 5, a straight portion with a negative slope. As the temperature Tj falls, the value of Imax is increased. Operation thus stabilizes around an operating point denoted 41 in FIG. 5. The fall in the temperature Tj may stem from the decrease in the value of the parameter Imax, in particular if the current $I_M$ in the motor was controlled to its maximum value or to a value close to this maximum value. It may also stem from another cause, for example from a decrease in the duty ratio $d_{com}$ of the setpoint control signal CDE if a transiently high setpoint in current was present.

In all cases, the value of the temperature Tj is not permitted to exceed a second threshold Tshd, corresponding to a cutout (or "shutdown") temperature, greater than the first threshold Tw corresponding to the warning temperature. This is why, for values of Tj beyond Tshd, the control of any current in the MOS transistors is interrupted, to avoid their destruction.

To summarize, the maximum value Imax permitted for the current in the load, that is to say for the current $I_M$ in the motor, varies between a high extreme value for the small values of the temperature Tj at the level of the junctions of the MOS transistors, and a low extreme value for the second threshold Tshd corresponding to the cutout temperature. Moreover, the value Imax follows an inverse linear variation, as a function of temperature Tj, for values of Tj greater than the first threshold Tw corresponding to the warning temperature. The equilibrium point between the maximum permitted value Imax of the current in the load on the one hand, and the junction temperature on the other hand, is substantially reached (that is to say to within possible oscillations, which may occur around the operating point) by the upper values of said current and by lower values of said temperature.

In an example, the first threshold Tw is of the order of 150° C., and the second threshold Tshd is of the order of 170° C., to guarantee a lifetime of 8000 hours, which is the standard in the automotive sector. It is indeed known that the lifetime of the transistors is inversely proportional to the time spent in operating at overly high temperatures. The Arrhenius law indicates that the lifetime is halved for each increase of 10° C. in the operating temperature. For example, if the transistors can operate for 1000 hours at 150° C., they will operate for 500 hours at 160° C., 250 hours at 170° C., etc. Thus, the 8000 hours have to be linked to a thermal profile (the aggregate time spent at each temperature). The product is customarily rated by fixing 1000 hours at a junction temperature of 150° C. (as if the 8000 hours should be spent at a junction temperature of 120° C.).

However, it is desired to use cheaper transistors, therefore not as big (that is to say with a narrower gate), which exhibit a higher internal resistance $Rds_{ON}$ and a likewise higher thermal resistance, than traditional transistors. The junction temperature of the transistors is therefore higher at constant value of current, or, as a corollary, the maximum permitted current Imax is lower for the same temperature threshold values of the TDCR mechanism. A dual impact on the thermal performance is therefore undergone at both these levels. It follows from this that, because of the TDCR mechanism, it is more rarely possible to power the load with the maximum current available, and this may be detrimental in certain applications and/or circumstances of use.

In order to compensate this phenomenon and allow operation with a load current that may transiently exceed the first threshold corresponding to the warning temperature Tw of FIG. 5, there is proposed an alternative to the known TDCR mechanisms.

The underlying idea consists in very slightly reducing the lifetime, so as to transiently allow the operation of the load under the maximum current even if the warning temperature is exceeded. Indeed, the expected transient currents are relatively frequent, but do not represent a significant aggregated duration and hardly affect the lifetime.

Figure 6:
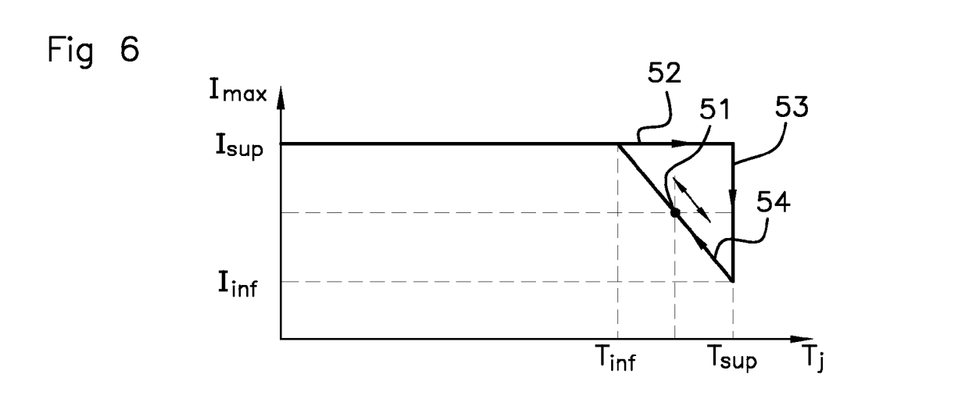
FIG. 6 is a graph illustrating the principle of a temperature-sensitive current reduction mechanism according to embodiments.

With reference to the graph of FIG. 6, the proposed mechanism may operate with a threshold Tsup. This threshold may for example be identical to the threshold Tshd (cutout threshold) of the prior art mechanisms if all other things are equal. For example, Tsup may therefore also be equal to about 170° C.

The maximum value Imax permitted for the current in the load (current $I_M$ in the motor) still varies between a high extreme value Isup for the small values of the temperature Tj at the level of the junctions of the MOS transistors, and a low extreme value Iinf for the values of the temperature which are greater than the threshold Tsup.

However, the curve giving the value of Imax as a function of Tj exhibits a hysteresis, as will be understood on reading what follows.

During the temperature climb phase, the value Tj of the junction temperature of the MOS transistors increases until it reaches the temperature Tsup, without modification of the maximum value Imax permitted for the current in the load which remains at the high extreme value Isup.

When the temperature Tj reaches the threshold Tsup (lower than or equal to the cutout temperature), the maximum value Imax permitted for the current in the load drops abruptly to the low extreme value Iinf. The expression "abruptly" is understood to mean that provision is made for the maximum reduction in the current in the load to be obtained immediately. The value Iinf may be zero, thus corresponding to a total zeroing of the current in the load. Preferably, however, it is very low with respect to the high extreme value Isup but not zero, so as to allow the load to remain operating, even if this entails a degraded operating mode. For example, the low extreme value may be equal to 2.5 A. Other values, low with respect to the value of the high extreme temperature, may of course be envisaged as a function of the application concerned. Let us also note that the current in the load is subject to the law of variation in an inductor, and therefore, there is a transient current of inductive discharge during which $I_M$ may be greater than Imax.

Finally, during the temperature descent phase, which necessarily follows the decrease in the current in the load, the value Imax is permitted to increase, for example linearly. It may regain the high extreme value Isup for a given value Tinf of the temperature Tj. The value Tinf corresponds to a temperature of return to the high extreme value Isup of the maximum value Imax Isup permitted for the current in the load. The system may be dimensioned so that the value Tinf may be substantially equal to the value Tw corresponding to the warning temperature of the prior art mechanisms, for example 150° C. as indicated previously. In this way, and if all other things are equal, the operating characteristics are not modified as regards the temperature descent phase.

It will be noted that the temperature varies all the more rapidly as the thermal resistance of the new transistors used is higher than that of the transistors used hitherto. The transistor does not remain at the temperature Tsup or at a temperature close to the latter for a very long time. But the fact of having immediately lowered the value of the current is not immediately followed by an effect. The temperature descends only in tempo with the time constant of the decay in current in the load. Tj may therefore slightly exceed the temperature Tsup. In the case where the cutout temperature is equal to the value Tsup, a time lag before cutout makes it possible to forestall the latter from occurring during transient phenomena such as these.

As will have been understood, embodiments of the invention make it possible, when a heavy transient current (that is to say a current causing a temperature rise beyond the threshold Tsup) is required, to exceed the limit in terms of current which would be imposed by a TDCR mechanism of the prior art as illustrated in FIG. 5. The point of equilibrium between the maximum permitted value Imax of the current in the load on the one hand, and the junction temperature Tj on the other hand, is reached through the lower values of said current and through the higher values of said temperature. This manner of operation contrasts totally with the previously mentioned characteristics of the prior art TDCR mechanisms.

Assuming that the control device is thus forced to operate transiently at a temperature equal to the threshold Tsup for 70 milliseconds every 5 seconds for the 2% of the lifetime where the surrounding temperature is sufficiently high (i.e. 160 hours), this represents fewer than 4 operating hours with Tj=Tsup. For Tsup=180° C., the law of Arrhenius gives, with respect to 120° C., an acceleration factor of 64. This signifies that these 4 hours are the equivalent of 256 hours at 120° C., that is to say 3% of the lifetime.

Thus, at the price of a slight cut in the margin available in the lifetime of the transistors, one circumvents the limiting effect of the TDCR mechanisms of the prior art which prevents one benefiting when necessary from the maximum current available, in a transient manner.

It will be noted that it may happen that the junction temperature Tj exceeds the warning threshold Tw of the mechanisms of the prior art, and remains above this threshold for a certain duration without however reaching the temperature Tsup. If this duration is relatively long, this situation may lead to the MOS transistor being damaged, for example.

This is why some embodiments envisage a safety feature, which will be explained with reference to the graph of FIG. 7.

In these embodiments, indeed, the maximum permitted value Imax of the current in the load is abruptly decreased to the lower limit value Iinf if, during the temperature climb phase, the temperature Tj is higher than the temperature threshold Tinf, lower than the temperature threshold Tshd, while being lower than said threshold Tsup, for a duration greater than a determined time lag, for example 2 s. The typical case envisaged here corresponds to the curve portion 63 in FIG. 7. The fast decrease in the current Imax is illustrated by the curve portion 63. When the current has decreased, the temperature Tj falls again and the current Imax can then be increased gradually to the upper limit value Isup as the temperature at the level of the switching element decreases. This is illustrated by the curve portion 64.

Figure 7:
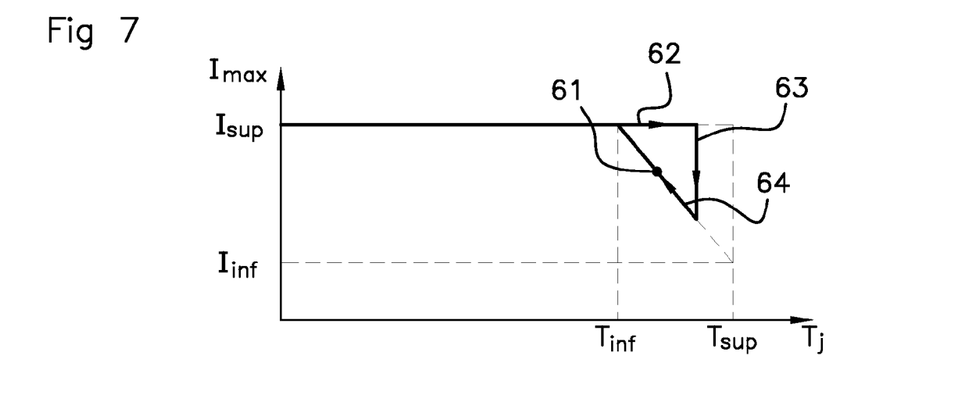
FIG. 7 is a graph illustrating the reduction in current in an exemplary implementation of a mechanism according to FIG. 6.

It will be noted that the curve of FIG. 7 can stabilize at an equilibrium point 61. Here again, this equilibrium is reached through higher values of the temperature and through lower values of the permitted maximum current Imax.

In the example shown in FIG. 7, the value of the low threshold can correspond to the value of the warning threshold Tw of the TDCR mechanisms of the prior art. In a general manner, the value of the threshold Tinf can be defined by reference to the value of the high threshold. In the example where Tsup=170° C. and Tinf=150° C., the value of the low threshold is substantially equal to the value of the high threshold less 12%.

The description hereinabove has been given by way of illustration only, and is not limiting of the scope of the invention. Any technically conceivable variant embodiment may be preferred to the embodiments described.

In particular, the generation of the digital signal Temp representative of the temperature Tj at the level of the P-N junctions of the MOS transistors can be carried out in the microcontroller which implements the control unit 2, on the basis of an external analog signal. The digital signal temp can also correspond to the output of two analog comparators, indicating the crossing of the thresholds Tinf and Tsup.

Likewise, the temperature threshold values are not limited to the examples given here purely by way of illustration, and may be any value suitable for the needs of the application.

Finally, the invention applies of course to the control of any inductive load, not solely to that of an electric motor. This may involve, for example, an electromagnetic actuator with fixed coil and moving core (or the converse).

The invention claimed is:
1. A control device for an inductive load comprising:
a switching structure with at least one switching element, adapted for driving a current of determined value in the load as a function of a setpoint datum (CDE), a control unit (2) designed to implement a control strategy to generate at least one control signal (S21, S31) for the switching element on the basis of the setpoint datum (CDE), with a mechanism consisting in defining a maximum permitted value (Imax) of the current in the load as a function of a value representative of the temperature at the level of the switching element, between an upper limit value (Isup) and a lower limit value (Iinf), the mechanism comprising means for:

holding constant the maximum permitted value (Imax) of the current, during a temperature climb phase, equal to the upper limit value (Isup), as long as the temperature at the level of the switching element is lower than a first temperature threshold (Tsup), abruptly rendering the maximum permitted value of the current equal to the lower limit value (Iinf) as soon as the value of the temperature at the level of the switching element reaches the first temperature threshold (Tsup), and permitting the maximum permitted value of the current to climb back gradually to the upper limit value (Isup), during a temperature descent phase, as the temperature at the level of the switching element decreases, so that an equilibrium point is found.

2. The device as claimed in claim 1, in which the setpoint datum is the duty ratio of a periodic setpoint control signal.

3. The device as claimed in claim 2, in which the lower limit value (Iinf) of the maximum permitted value (Imax) of the current in the load is about 2.5 A.

4. The device as claimed in claim 1, in which the lower limit value (Iinf) of the maximum permitted value (Imax) of the current in the load is about 2.5 A.

5. The device as claimed in claim 1, in which the first temperature threshold (Tsup) is a cutout threshold.

6. The device as claimed in claim 5, in which the mechanism is such that, furthermore, if during the temperature climb phase the temperature is greater than a second determined temperature threshold, lower than the first temperature threshold (Tsup), while being lower than said first temperature threshold (Tsup), for a duration greater than a determined time lag, then the maximum permitted value of the current is abruptly decreased to the lower limit value (Iinf) before being permitted to climb back gradually to the upper limit value (Isup) during the temperature descent phase.

7. The device as claimed in claim 6, in which the value of the second temperature threshold is substantially equal to the value of the first threshold less 10% to 15%.

8. The device as claimed in claim 1, in which the switching element comprises a transistor.

9. An integrated circuit characterized in that it comprises a device as claimed in claim 1.

10. The device as claimed in claim 1, in which the first temperature threshold (Tsup) is a cutout threshold, whose value is 170° C.

11. The device as claimed in claim 10,
in which the mechanism is such that, furthermore, if during the temperature climb phase the temperature is greater than a second determined temperature threshold, lower than the first temperature threshold (Tsup), while being lower than said first temperature threshold (Tsup), for a duration greater than a determined time lag, then the maximum permitted value of the current is abruptly decreased to the lower limit value (Iinf) before being permitted to climb back gradually to the upper limit value (Isup) during the temperature descent phase, and in which the value of the second temperature threshold is substantially equal to the value of the first threshold less 10% to 15%.

12. The device as claimed in claim 1, in which the switching element comprises an MOS transistor.

13. A control method for an inductive load comprising the steps of:

driving a current of determined value in the load as a function of a setpoint datum (CDE), with the aid of a switching structure having at least one switching element, implementing a control strategy to generate at least one control signal (S21, S31) for the switching element on the basis of the setpoint datum (CDE), with a mechanism consisting in defining a maximum permitted value (Imax) of the current in the load as a function of a value representative of the temperature at the level of the switching element, between an upper limit value (Isup) and a lower limit value (Iinf), characterized in that the mechanism is such that:

during a temperature climb phase, the maximum permitted value (Imax) of the current is held constant, equal to the upper limit value (Isup), as long as the temperature at the level of the switching element is lower than a first temperature threshold (Tsup), the maximum permitted value (Imax) of the current is abruptly rendered equal to the lower limit value (Iinf) as soon as the value of the temperature at the level of the switching element reaches the first temperature threshold (Tsup) and, during a temperature descent phase, the maximum permitted value (Imax) of the current is permitted to climb back gradually to the upper limit value (Isup) as the temperature at the level of the switching element decreases.

14. The method as claimed in claim 13, in which the setpoint datum is the duty ratio of a periodic setpoint control signal.

15. The method as claimed in claim 14, in which the first temperature threshold (Tsup) is a cutout threshold (Tj).

16. The method as claimed in claim 15, in which the mechanism is such that, furthermore, if during the temperature climb phase the temperature is greater than a second determined temperature threshold, lower than the first temperature threshold (Tsup), while being lower than said first threshold (Tsup), for a duration greater than a determined time lag, then the maximum permitted value (Imax) of the current is abruptly decreased to the lower limit value (Iinf) before being permitted to climb back gradually to the upper limit value (Isup) as the temperature at the level of the switching element decreases.

17. The method as claimed in claim 16, in which the value of the second temperature threshold is substantially equal to the value of the first threshold less 10% to 15%.

18. The method as claimed in claim 14, in which the lower limit value (Iinf) of the maximum permitted value (Imax) of the current in the load is about 2.5 A.

19. The method as claimed in claim 13, in which the lower limit value (Iinf) of the maximum permitted value (Imax) of the current in the load is about 2.5 A.

20. The method as claimed in claim 19, in which the first temperature threshold (Tsup) is a cutout threshold (Tj), whose value is substantially equal to 170° C.

* * * * *